United States Patent [19]

Keshtbod

[11] Patent Number: 4,527,255
[45] Date of Patent: Jul. 2, 1985

[54] NON-VOLATILE STATIC RANDOM-ACCESS MEMORY CELL

[75] Inventor: Parviz Keshtbod, Los Altos, Calif.

[73] Assignee: Signetics Corporation, Sunnyvale, Calif.

[21] Appl. No.: 395,531

[22] Filed: Jul. 6, 1982

[51] Int. Cl.³ ............................................. G11C 11/40
[52] U.S. Cl. .................................. 365/154; 365/185; 357/23.5
[58] Field of Search ............... 365/154, 156, 185, 190, 365/202, 182, 184; 357/23 VT

[56] References Cited

U.S. PATENT DOCUMENTS

| | | | |
|---|---|---|---|
| 4,095,281 | 6/1978 | Denes | 365/156 |
| 4,128,773 | 12/1978 | Troutman et al. | 365/156 X |
| 4,132,904 | 1/1979 | Harari | 365/154 X |
| 4,207,615 | 6/1980 | Mar | 365/154 X |
| 4,342,101 | 7/1982 | Edwards | 365/154 |

OTHER PUBLICATIONS

E. Harari et al., "A 256–Bit Nonvolatile Static RAM", 1978 *IEEE ISSCC Dig. of Tech. Papers*, Feb. 16, 1978, pp. 108–109.
J. Drori et al., "A Single 5V Supply Nonvolatile Static RAM", 1981 *IEEE ISSCC Dig. of Tech. Papers*, Feb. 19, 1981, pp. 148–149.

Primary Examiner—Joseph A. Popek
Attorney, Agent, or Firm—R. J. Meetin; R. T. Mayer; J. Oisher

[57] ABSTRACT

A non-volatile memory cell (20) contains a pair of cross-coupled like-polarity FET's (Q1 and Q2) that serve as a volatile location (21) for storing a data bit and a like-polarity variable-threshold insulated-gate FET (Q3) that serves as a non-volatile storage location (22). The variable-threshold FET has its source coupled to the drain of one of the cross-coupled FET's, its insulated-gate electrode coupled to the drain of the other of the cross-coupled FET's, and its drain coupled to a power supply. A pair of impedance elements (R1 and R2) are coupled between the drains of the cross-coupled FET's, respectively, on one hand and the power supply on the other hand. Just before a power shutdown which causes the data bit to evaporate, the power supply is pulsed to a suitable level to cause the bit to be transferred to the non-volatile location. When power is restored to the normal level, the original data bit automatically returns to the volatile location.

17 Claims, 4 Drawing Figures

NON-VOLATILE STATIC RANDOM-ACCESS MEMORY CELL

FIELD OF USE

This invention relates generally to semiconductor memories and more particularly to non-volatile random-access memory (RAM) cells employing field-effect transistors (FET's) for information storage.

BACKGROUND ART

Avoiding the loss of data stored in the memory cells of a semiconductor memory during a power shutdown is an important problem in memory design and use. Such a power shutdown may be anticipated sufficiently far in advance to allow time to transfer the data from the memory cells to a separate non-volatile storage location in the memory—i.e., a storage location which does not require power for preserving the data. Commonly, however, shutdown occurs without adequate warning to allow data transfer to the separate non-volatile location. It is therefore desirable to incorporate a non-volatile storage site directly in each cell.

In "A 256-Bit Nonvolatile Static RAM," 1978 *IEEE ISSCC Dig. of Tech. Papers,* Feb. 16, 1978, pp. 108–9, E. Harari et al. disclose a memory cell for achieving the foregoing objective. In this static RAM cell, a pair of cross-coupled P-channel FET's form a volatile random-access location for storing a data bit. The P-channel FET's are individually connected through their drains to the drains of a pair of cross-coupled variable-threshold floating-gate N-channel FET's which form a non-volatile storage location. Just prior to a power shutdown, the cell power supply is raised from its normal value of 5-10 volts up to about 20 volts for 10 microseconds. This places the non-volatile location in a state indicative of the data bit contained in the volatile location. In particular, the threshold voltage of one of the N-channel floating-gate FET's goes to a positive value while the threshold voltage of the other floating-gate FET goes to an opposing negative value. When the power is shut down, the P-channel FET's both turn off to cause the bit in the volatile storage location to "evaporate". However, the threshold voltages of the N-channel FET's remain at their opposing values. As power is restored, the opposing threshold voltages of the N-channel FET's cause the complement of the original data bit to appear in the volatile location. B. Troutman et al. disclose substantially the same arrangement in FIG. 2b of U.S. Pat. No. 4,128,773, except that the FET polarities are reversed. In either of these non-volatile RAM cells, an additional pair of FET's serve as a load circuit.

In U.S. Pat. No. 4,095,281 with particular reference to FIG. 2, G. Denes discloses another memory cell that appears to operate in basically the same manner as that of Harari et al. or Troutman et al. The principal difference is that Denes uses P metal-nitride-oxide semiconductor (MNOS) FET's for the variable-threshold FET's and does not use an additional pair of FET's in the load circuit.

Although these prior art devices provide non-volatile data storage, none of them return the original data bit to the volatile storage locations in the memory cells when power is restored. Instead, a separate operation must normally be performed to invert the complement data to get back the data in its original form. This is undesirable since it requires further time and/or circuitry.

In "A Single 5 V Supply Nonvolatile Static RAM," 1981 *IEEE ISSCC Dig. of Tech. Papers,* Feb. 19, 1981, pp. 148–9, J. Drori et al. disclose a non-volatile RAM cell that avoids the inconvenience of having the complement of the original data bit returned to the cell after a power shutdown. This cell requires at least six FET's in addition to a triple polycrystalline silicon floating-gate structure for preserving the original data bit during shutdown and, consequently, is relatively complex.

DISCLOSURE OF THE INVENTION

A non-volatile memory cell which has a pair of cross-coupled like-polarity FET's that serve as a volatile location for storing a given data bit contains a like-polarity variable-threshold insulated-gate FET that serves as a non-volatile storage location. The cross-coupled FET's, designated for convenience as the first FET and the second FET, have their sources coupled to a reference voltage supply and their drains coupled through a load circuit to a power supply. The variable-threshold FET has its source coupled to the drain of the first FET, its insulated-gate electrode coupled to the drain of the second FET, and its drain coupled to the power supply. Preferably, the variable-threshold FET is a floating-gate device.

Just before a power shutdown which causes the data stored in the volatile cell locations in a memory containing a group of the present cells to evaporate, the power supply is pulsed to a suitable level to cause the data in the volatile locations to be transferred simultaneously to the corresponding non-volatile locations in the memory cells. When power is restored, the original data bit in each memory cell automatically returns to its volatile storage location.

More particularly, the present memory cell operates as follows. The threshold voltage of the variable-threshold FET increases as a control voltage applied from its insulated-gate electrode to its source is increased within a first voltage range and decreases as a control voltage applied from its source to its insulated-gate electrode is increased within a second voltage range (which is typically the same as the first range). The power supply provides a supply voltage at a first level $V_{DD1}$ for normal storage of the given data bit in the cross-coupled FET pair. The current through the variable-threshold FET and the load circuit is so controlled that the variable-threshold FET assumes a logic state corresponding to the given data bit when the supply voltage is moved to a more extreme second level $V_{DD2}$. For example, in the case of N-channel devices where the reference voltge supply is at ground reference and $V_{DD1}$ is 5 volts, $V_{DD2}$ is 20 volts. The original data bit is then automatically restored to the cross-coupled FET's when the supply voltage is returned to $V_{DD1}$.

The load circuit contains a first impedance element coupled between the power supply and the drain of the first FET and a second impedance element coupled between the power supply and the drain of the second FET. During cell operation, the sum of the current through the first impedance element and through the variable-threshold FET when it is fully conductive significantly exceeds the current through the second impedance element which, in turn, significantly exceeds the current through the first impedance element.

In an option, the memory cell further includes another like-polarity variable-threshold insulated-gate FET in the non-volatile storage location. This second variable-threshold FET has its source coupled to the drain of the second FET, its insulated gate electrode coupled to the drain of the first FET, and its drain coupled to the power supply. The second variable-threshold FET is praferably a flcating-gate device and is controlled in the same manner as the first variable-threshold FET.

Because the variable-threshold FET's are cross-coupled in this option, one is off when the other is on. They operate as a flip-flop in storing a data bit. To enable the data bit stored in the volatile location to be transferred to the non-volatile location when the supply voltage is moved from $V_{DD1}$ to $V_{DD2}$ and thereafter to restore the original data bit to the volatile location whenever the supply voltage returns to $V_{DD1}$, the current through either variable-threshold FET when it is fully conductive significantly exceeds the current through either impedance element.

A significant advantage of the present memory cell is that precisely the same data bit that existed in the volatile storage location before a power shutdown is returned to the volatile location after shutdown. In comparison to conventional memory cells which restore the complement of the original data bit after a power shutdown, the present memory cell is faster. It avoids the time lost due to the inconvenience of operating with the complementary data bit or the time wasted because of the necessity to perform an additional operation to convert the complementary bit back into the original bit. In comparison to conventional memory cells that do restore the original bit after power shutdown, the present memory cell contains fewer elements. This makes it both easier to fabricate and faster because storage and retrival of the data bit from the non-volatile location do not interfere with the other operation of the cell.

A particularly useful feature of a RAM utilizing a group of the present memory cells is that the variable-threshold FET's can be employed as a "permanent" memory at any time by temporarily moving the power supply to $V_{DD2}$ to write the data from the volatile locations into the non-volatile locations in the cells. The power supply is then returned to $V_{DD1}$ but is not turned off. The volatile locations can now be employed as a "working" RAM on which various operations are performed. If the original data is again needed, it can be restored to the volatile locations at any time by briefly turning off the power and then returning it to $V_{DD1}$.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1:
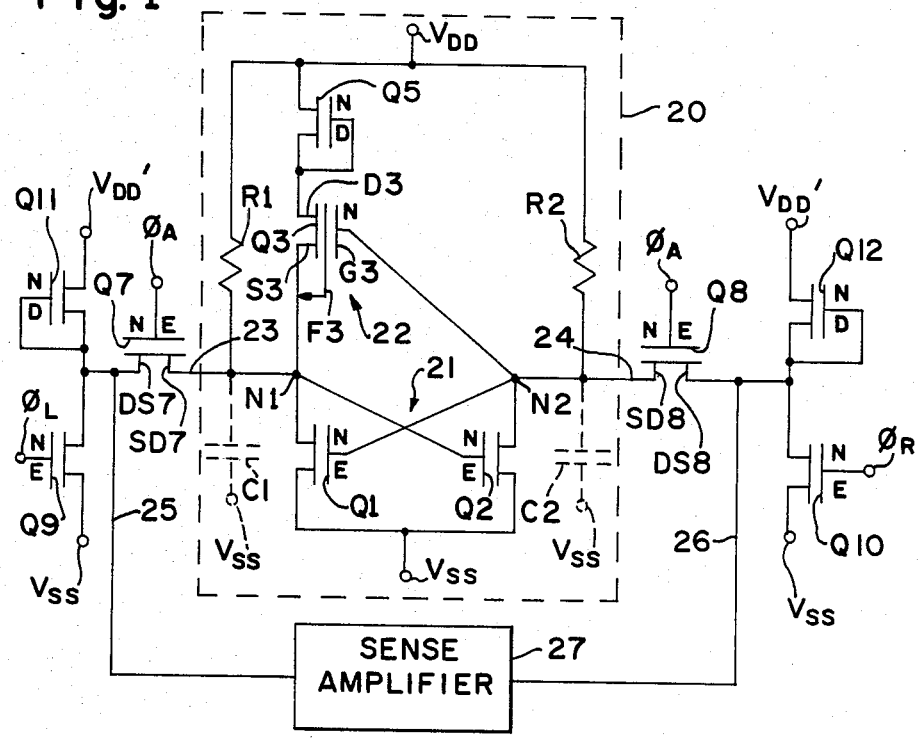
FIG. 1 is a circuit diagram of a memory circuit containing an embodiment of a memory cell in accordance with the invention.

Referring to the drawings, FIG. 1 illustrates an MOS memory circuit which is typically one of a group of such memory circuits arranged in a matrix of rows and columns to form a non-volatile static RAM. Each of the FET's in FIG. 1 is an N-channel insulated-gate device as indicated by the "N" next to its insulated gate electrode. "E" or "D" next to the gate electrode of each fixed-threshold FET indicates that it is an enhancement-mode device or a depletion-mode device, respectively. Each fixed-threshold enhancement-mode FET has a threshold voltage ($V_T$) of about 0.8 volt.

The memory circuit of FIG. 1 consists of a bi-stable static memory cell 20 in combination with an external circuit for writing a binary data bit into cell 20 and for reading the data bit out of cell 20. The external circuit supplies the bit to a volatile storage location 21 in cell 20. Location 21 consists of a pair of cross-coupled FET's Q1 and Q2 whose sources are connected to a reference voltage supply that provides a substantially constant reference voltage $V_{SS}$ at ground potential (0 volt). Each FET Q1 or Q2 has a gate width-to-length ratio (W/L) of 12/3.

The drains of FET's Q1 and Q2 are coupled by way of nodes N1 and N2, respectively, through an unbalanced load circuit to a power supply which provides a supply voltage $V_{DD}$ whose normal operational level $V_{DD1}$ is 5 volts. The load circuit consists of a resistor R1 connected between the $V_{DD}$ power supply and node N1 and a resistor R2 similarly connected between the $V_{DD}$ supply and node N2. Resistor R1 is about 500 megaohms while resistor R2 is about 50 megaohms. Associated with nodes N1 and N2 relative to $V_{SS}$ are parasitic capacitances C1 and C2, respectively. When no active operation is being performed on cell 20, the resistor R1 or R2 associated with the particular FET Q1 or Q2 that is turned off only supplies leakage current to the associated node N1 or N2 to maintain the associated capacitance C1 or C2 at a charging level of 5 volts.

The data bit in both cell 20 and storage location 21 is defined to be a logical "0" (hereafter simply a "0") when FET Q1 is off and FET Q2 is fully conductive. The bit is defined to be a logical "1" (hereafter simply a "1") when FET Q1 is fully conductive and FET Q2 is off. Opposite definitions could be employed as well. The bit in location 21 "evaporates" whenever the $V_{DD}$ supply drops below a particular level, for example, down to 0 volt during a power shutdown.

Cell 20 contains an unbalanced non-volatile storage location 22 comprising a variable-threshold floating-gate FET Q3 whose source S3 is connected to the drain of FET Q1 and whose insulated-gate electrode G3 is connected to the drain of FET Q2. FET Q3 has a single floating-gate electrode F3 which is separated from source S3 by a thin layer of electrically insulating material whose minimum thickness is in the range of 50 to 200 angstroms which enables the threshold voltage of FET Q3 to be electrically altered. Its $V_T$ increases as a voltage $V_{3GS}$ applied from insulated-gate electrode G3 to source S3 is appropriately increased so as to cause electrons to tunnel from source S3 into floating-gate electrode F3. Likewise, its $V_T$ decreases as a voltage $V_{3SG}$ applied from source S3 to electrode G3 is appropriately increased so as to cause electrons to tunnel from floating gate F3 into source S3. Normally, voltage $V_{3GS}$ or $V_{3SG}$ must be raised above 10 volts to cause tunneling through the thin insulating layer when it has a preferred minimum thickness of 80 angstroms. Gate electrodes F3 and G3 are separated from each other by another layer of electrically insulating material that is sufficiently thick so as to prevent electron tunneling between them when voltage $V_{3GS}$ or $V_{3SG}$ is so varied.

FET Q3 has a W/L of 3/15 for insulated gate G3 and a W/L of 3/17 for floating gate F3.

When the $V_T$ of FET Q3 is sufficiently negative that it is turned on while the $V_{DD}$ supply is at $V_{DD1}$, non-volatile location 22 (as represented by FET Q3) is at the "0" logic state. Similarly, when the $V_T$ of FET Q3 is sufficiently positive that it is turned off while the $V_{DD}$ supply is at $V_{DD1}$, location 22 is at the "1" state.

The drain D3 of FET Q3 is coupled through a current-limiting element to the $V_{DD}$ supply. The current-limiting element is a depletion-mode FET Q5 whose source and gate electrode are commonly connected to drain D3 and whose drain is connected to the $V_{DD}$ supply. FET Q5 has a W/L of 2/8 and a $V_T$ of $-0.4$ volt. FET Q5 is continually on as long as the $V_{DD}$ supply provides power to cell 20. Irrespective of the level of supply voltage $V_{DD}$, FET Q5 limits the current through FET Q3 when it is fully conductive to about 1 $\mu$a. Because each of FET's Q1 and Q2 can accommodate over 100 times this current, the on/off condition of FET Q3 does not affect the logic state of volatile location 21 when the $V_{DD}$ supply is at 5 volts.

An access signal $\phi_A$ applied to the gate electrodes of a pair of FET's Q7 and Q8 in the external circuit controls access to cell 20 for read/write operations. One source/drain element SD7 of FET Q7 is connected by way of a line 23 through node N1 to the gate electrode of FET Q2. Likewise, one source/drain element SD8 of FET Q8 is connected by way of a line 24 through node N2 to the gate electrode of FET Q1. Each FET Q7 or Q8 has a W/L of 8/3.

Any one of a number of circuitry arrangements can be utilized in performing read/write operations on cell 20 through FET's Q7 and Q8. A suitable example of the read/write circuitry is illustrated in FIG. 1.

In this example, a pair of FET's Q9 and Q10 which are several times as large as FET's Q1 and Q2 are connected between the $V_{SS}$ supply on one hand and the other source/drain elements DS7 and DS8, respectively, of FET's Q7 and Q8, respectively, on the other hand. FET's Q9 and Q10 are controlled by data signals $\phi_L$ and $\phi_R$, respectively. FET's Q9 and Q10 receive current from a substantially constant 5.0-volt VDD' supply by way of resistively-connected depletion-mode FET's Q11 and Q12, respectively.

In writing data into cell 20, one of data signals $\phi_L$ and $\phi_R$ is set at an appropriate value above the $V_T$ of the associated FET Q9 or Q10 to make it fully conductive while the other of data signals $\phi_L$ and $\phi_R$ is set at another appropriate value below the $V_T$ of the other FET Q10 or Q9 to keep it in the non-conductive state. The voltage at the drain of the fully-conductive FET Q9 or Q10 is then at a low value near 0 volt while the voltage at the drain of the non-conductive FET Q10 or Q9 is at a high level near 5 volts. Access signal $\phi_A$ is next raised to 5 volts to turn on FET's Q7 and Q8. The low and high voltages at the drains of FET's Q9 and Q10 are then transmitted to the gate electrodes of FET's Q1 and Q2. This forces one of them to turn on while causing the other to turn off. In particular, a "0" is written into volatile location 21 to turn off FET Q1 and turn on FET Q2 when signal $\phi_L$ is at 0 volt and signal $\phi_R$ is at 5 volts. A "1" is written into location 21 when signals $\phi_L$ and $\phi_R$ are reversed. Because FET's Q11 and Q12 can transmit many times the currents supplied to nodes N1 and N2 through the load R1 and R2 and FET Q3 when it is on, its on/off condition does not affect the logic state achieved in location 21 during a write operation.

For interrogating cell 20, a pair of lines 25 and 26 are connected between a sense amplifier 27 of conventional design and source/drain elements DS7 and DS8, respectively. During a read operation, signals $\phi_L$ and $\phi_R$ are set at their low values so that FET's Q9 and Q10 are off. Signal $\phi_A$ is raised to 5 volts to turn on FET's Q7 and Q8. When sense amplifier 27 is activated, it senses the voltage difference between nodes N1 and N2 along lines 25 and 26 to determine the logic state in location 21.

With FET's Q7 and Q8 turned off to isolate cell 20, a data bit is transferred between locations 21 and 22 in the following manner. The $V_{DD}$ supply is initially at its normal value $V_{DD1}$ of 5 volts. FET Q3 may be on or off depending on how it was programmed in the preceding programming cycle for non-volatile location 22.

Consider first the case in which volatile location 21 contains a "0" with FET Q1 off and FET Q2 on. The voltage at node N1 is 5 volts, while the voltage at node N2 is 0 volt so that voltage $V_{3SG}$ is 5 volts. This is insufficient to cause tunneling between floating gate F3 and source S3.

The $V_{DD}$ supply is now raised for 20-40 milliseconds up to a high level $V_{DD2}$ of 20 volts. This acts to write a "0" into location 22. In particular, FET Q1 remains off as current flows through resistor R1 and through FET Q3 if it is on to bring node N1 to 20 volts. This causes FET Q2 to turn on harder as it draws more current through resistor R2. Node N2 remains at 0 volt. Voltage $V_{3SG}$ thereby rises to 20 volts which induces about 5 volts on floating gate F3. If it does not already contain a suitable positive charge remaining from the previous programming cycle of location 21, the resultant 15-volt difference between source S3 and gate F3 causes electrons to tunnel from gate F3 through the thin oxide to source S3 to leave a positive charge on gate F3. Its $V_T$ drops down to approximately $-5$ volts. If not already on, FET Q3 turns on to place a "0" in non-volatile location 22.

Next, the power to cell 20 is shut down by dropping supply voltage $V_{DD}$ down to the 0-volt $V_{SS}$ level. FET's Q1 and Q2 both turn off, and the "0" in location 21 "evaporates". However, the positive charge remains on floating gate F3 during power shutdown, enabling location 22 to retain its "0".

At some future time, power is restored by bringing the $V_{DD}$ supply back up to the 5-volt $V_{DD1}$ level. The voltage at node N2 starts to rise from 0 volt which is greater than the negative $V_T$ that FET Q3 now has. This causes FET Q3 to turn on very rapidly and provide about 1 $\mu$a to node N1. Initially, resistor R1 provides about 10 na to node N1, while resistor R2 provides about 100 na to node N2. Capacitances C1 and C2 both begin to charge as the voltages at nodes N1 and N2 rise. However, the total current supplied to node N1 through resistor R1 and FET Q3 exceeds the current supplied to node N2 through resistor R2 by a factor of approximately 10. Consequently, capacitance C1 charges approximately 10 times as fast as capacitance C2. Node N1 then reaches the 0.8-volt $V_T$ of FET Q2 to turn it on before node N2 can reach the 0.8-volt $V_T$ of FET Q1. As FET Q2 turns on, it pulls the voltage at node N2 back down so as to keep FET Q1 off. Node N1 continues to rise up to 5 volts to latch a "0" in location 21, thus restoring its original logic state.

The operation is similar in the opposite situation in which location 21 originally contains a "1". Node N1 is initially at 0 volt, and node N2 is initially at 5 volts. Voltage $V_{3GS}$ is also 5 volts. When the $V_{DD}$ supply is pulsed to 20 volts, node N1 remains at 0 volt while node N2 rises to 20 volts. FET Q2 remains off, and FET Q1 turns on harder to accommodate the increased current provided through resistor R1. Voltage $V_{3GS}$ rises to 20 volts which induces approximately 15 volts on gate F3. Unless it is already negatively charged from the previous programming cycle, electrons tunnel from source S3 through the thin oxide to gate F3 to charge it negatively and increase its $V_T$ to approximately 6.5 volts. If not already off, FET Q3 turns off to place a "1" in location 22.

The negative charge remains on gate F3 during the subsequent power shutdown. When the $V_{DD}$ supply is restored to 5 volts, the voltages at nodes N1 and N2 begin to rise. However, node N2 cannot rise above the 6.5-volt $V_T$ of FET Q3, so it remains off. Initially, resistor R1 again supplies about 10 na to node N1. Likewise resistor R2 again initially provides about 100 na to node N2. Because the current supplied to node N2 through resistor R2 exceeds the current supplied to node N1 through resistor R1 by a factor of about 10, capacitance C2 charges approximately 10 times as fast as capacitance C1. Consequently, node N2 reaches the $V_T$ of FET Q1 to turn it on before node N1 reaches the $V_T$ of FET Q2. As FET Q1 turns on, it draws current to reduce the voltage at node N1 and keep FET Q2 off. Node N2 continues to rise to 5 volts to latch location 21 at its original "1".

In a second mode of operation, the $V_{DD}$ supply is again pulsed from 5 to 20 volts for 20–40 msec to program the logic state of volatile location 21 into non-volatile location 22. Instead of cutting off the power to cell 20, the $V_{DD}$ supply is returned to 5 volts. The original logic state remains in location 21. In a memory consisting of a group of cells 20, the portion consisting of locations 21 may now be used as a "working" memory whose data may be changed in any desired way. Should the original data written into the memory be needed, this information can be recalled from the "permanent" memory consisting of locations 22. This is accomplished by turning off FET's Q7 and Q8 for each cell 20, dropping the $V_{DD}$ supply down to 0 volt for 20–40 msec, and then returning it to 5 volts. The events described above for the first mode when the $V_{DD}$ supply is raised from 0 volt to 5 volts again occur in each cell 20 so as to restore the original data.

Figure 2:
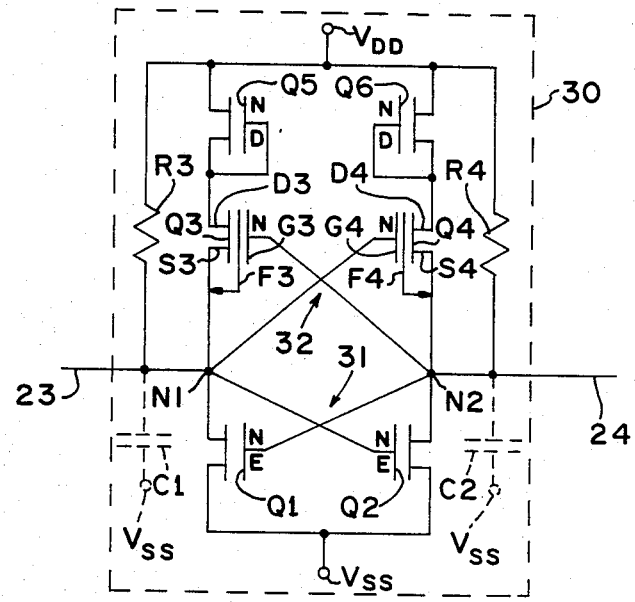
FIG. 2 is a circuit diagram of another embodiment of a memory cell in accordance with the invention employable in the memory circuit of FIG. 1.

FIG. 2 illustrates an embodiment of another bi-stable memory cell 30 employable with the external circuit shown in FIG. 1. The conventions adopted above for FIG. 1 are likewise employed in FIG. 2. Cell 30 consists of a volatile storage location 31, a balanced load circuit for location 31, and a balanced non-volatile storage location 32. Volatile location 31 consists of FET's Q1 and Q2 configured in the same manner as in location 21 and connected by lines 23 and 24 to the external circuit shown in FIG. 1. FET's Q1 and Q2 in location 31 are also the same size and have the same $V_T$'s as in location 21.

The load in FIG. 2 consists of resistors R3 and R4 configured in the same manner as resistors R1 and R2, respectively, in FIG. 1. However, resistors R3 and R4 are substantially identical, each being about 500 megaohms.

In addition to variable-threshold FET Q3 and current-limiting FET Q5 connected in the same manner as in FIG. 1, non-volatile location 32 contains another variable-threshold FET Q4 and an associated current-limiting element. FET Q4 is substantially identical to FET Q3, likewise having a W/L of 3/15 for its insulated-gate electrode G4 and a W/L of 3/17 for its single floating-gate electrode F4. The drain of FET Q1 is connected to electrode G4 while the source S4 of FET Q4 is connected to the drain of FET Q2. Floating gate F4 is separated from source S4 by a thin layer of electrically insulating material whose thickness is the same as that of the corresponding thin insulating layer of FET Q3 so as to enable the $V_T$ of FET Q4 to be electrically altered. Its $V_T$ increases as a voltage $V_{4GS}$ applied from electrode G4 to source S4 is appropriately increased to cause electron tunneling from source S4 into floating gate F4 and decreases as a voltage $V_{4SG}$ applied from source S4 to electrode G4 is appropriately increased to cause electron tunneling back to source S4.

When the $V_T$ of FET Q3 is sufficiently negative that it is turned on and the $V_T$ of FET Q4 is sufficiently positive that it is turned off while the $V_{DD}$ supply is at $V_{DD1}$, non-volatile location 32 (as represented by FET's Q3 and Q4) is in the "0" state. The converse exists when the $V_T$ of FET Q3 is sufficiently positive that it is off and the $V_T$ of FET Q4 is sufficiently negative that it is on while the $V_{DD}$ supply is at $V_{DD1}$.

The current-limiting element for FET Q4 is a depletion-mode FET Q6 whose drain is connected to the $V_{DD}$ supply and whose gate electrode and source are connected in common to the drain D4 of FET Q4. FET Q6 is substantially identical to FET Q5, likewise having a W/L of 2/8 and a $V_T$ of −0.4 volt. FET Q6 is continually on as long as cell 30 is powered and limits the current through FET Q4 to about 1 μa. Because each FET Q1 or Q2 can accommodate over 100 times this current, the on/off condition of FET's Q3 and Q4 does not affect the logic state of location 31.

Cell 30 operates similarly to cell 20. Read and write operations are performed in the same manner.

In transferring a data bit between locations 31 and 32 with FET's Q7 and Q8 off, one of FET's Q3 and Q4 is on and the other is off. For example, first consider the case when volatile location 31 initially contains a "0" with FET Q1 turned off and FET Q2 turned on. Node N1 is at 5 volts while node N2 is at 0 volt.

In one mode of operation, the $V_{DD}$ supply is raised from the $V_{DD1}$ level of 5 volts to the $V_{DD2}$ level of 20 volts for 20–40 msec. Node N1 rises to 20 volts as FET Q2 turns on harder while node N2 remains at 0 volt and FET Q1 remains off. Voltage $V_{3SG}$ rises to 20 volts to induce about 5 volts on floating gate F3. Unless it is already appropriately positively charged, electrons tunnel from gate F3 to source S3 to leave a resulting positive charge on gate F3 and decrease the $V_T$ of FET Q3 to about −5 volts. Likewise, voltage $V_{4GS}$ rises to 20 volts to induce about 15 volts on floating gate F4. Unless it is already appropriately negatively charged, electrons tunnel from source S4 to gate F4 to leave a net negative charge on gate F4 and increase the $V_T$ of FET Q4 to about 6.5 volts. Location 32 is then at "0" with FET Q3 turned off while FET Q4 is turned on.

As with cell 20, the $V_{DD}$ supply is dropped down to 0 volt. The "0" in volatile location 31 evaporates, but FET's Q3 and Q4 retain the charges stored on gates F3 and F4 to enable non-volatile location 32 to maintain its "0" during power shutdown.

At a later time, the $V_{DD}$ supply is returned to 5 volts. At the instant that power is restored, nodes N1 and N2 are each at 0 volt. This causes FET Q3 having the negative $V_T$ to begin to conduct and provide about 1 µa to node N1. FET Q4 having the positive $V_T$ remains off. Resistor R1 provides about 10 na to node N2. Both capacitances C1 and C2 begin to charge. Because the total current supplied to node N1 through resistor R1 and FET Q3 exceeds the total current supplied to node N2 through resistor R2 by a factor of about 100, capacitance C1 charges much more rapidly than capacitance C2. Accordingly, node N1 reaches the $V_T$ of FET Q2 to turn it on before node N2 can reach the $V_T$ of FET Q1. As FET Q2 turns on, it draws node N2 back down to 0 volt so as to keep FET Q1 turned off. Node N1 continues to rise to 5 volts as volatile location 31 latches in its original "0" state.

Precisely the opposite occurs when location 31 is initially at "1" with FET Q1 on and FET Q2 off. When the $V_{DD}$ supply is raised from 5 volts to 20 volts, node N1 stays at 0 volt and node N2 rises from 5 volts to 20 volts. FET Q3 turns off as its $V_T$ reaches a positive level of 6.5 volts. FET Q4 turns on as its $V_T$ reaches a negative level of $-5$ volts. This constitutes a "1" in location 32. The resultant negative and positive charges on gates F3 and F4 remain during the subsequent power shutdown. When power is restored to 5 volts, capacitance C2 charges much more rapidly through resistor R4 and FET Q4 than capacitance C1 charges through resistor R3. Acordingly, FET Q4 turn on first while FET Q3 remains off as location 31 latches in its original "1" state.

As with cell 20, cell 30 may be operated in a second mode in which the $V_{DD}$ supply is pulsed to 20 volts to program the logic state of location 31 into location 32 after which the $V_{DD}$ supply is returned to 5 volts (rather than being shut down). In a group of memory cells 30, the portion consisting of locations 31 then serves as a "working" memory while the portion consisting of locations 32 forms a "permanent" memory. At any time, the original data in the memory can be restored in the manner described above for the second mode of operation of cell 20.

Figure 3:
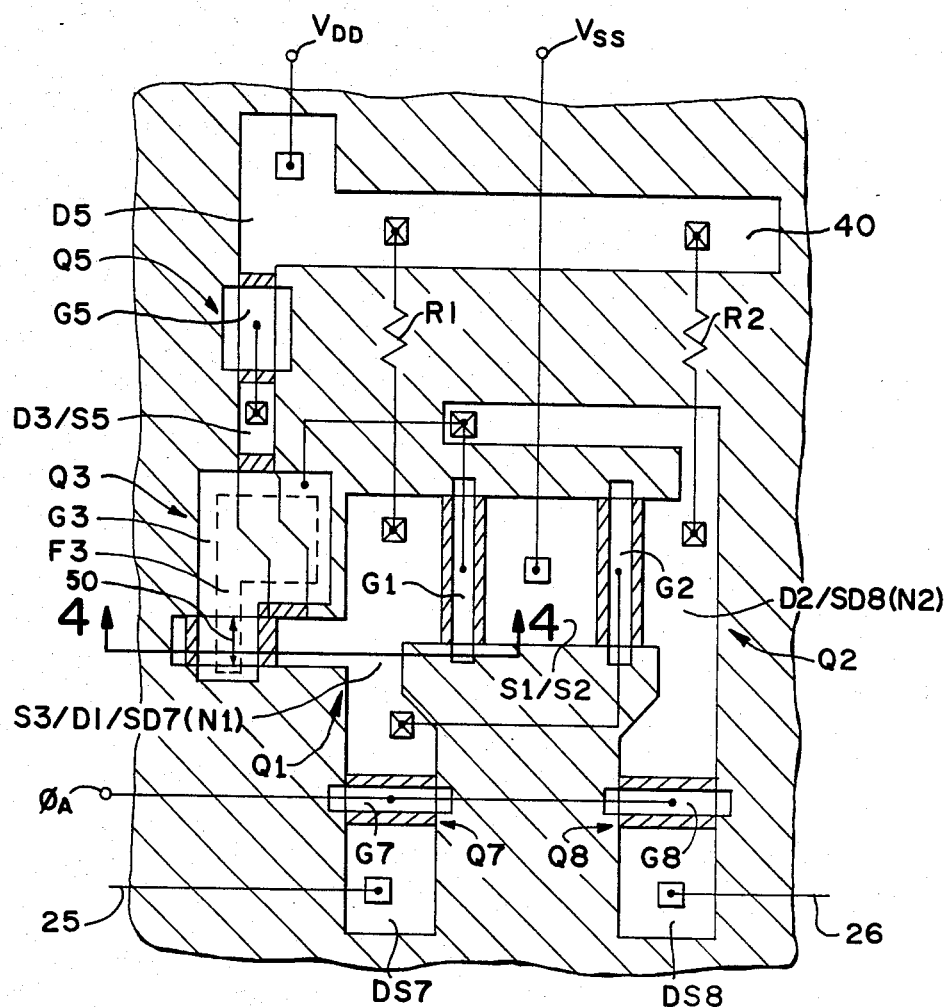
FIG. 3 is a layout view of the memory cell of FIG. 1.

Methods for manufacturing the various elements of the present invention are well known in the semiconductor art. FIG. 3 shows a layout view of a preferred embodiment of memory cell 20 manufactured according to N-channel planar processing techniques using oxide isolation to separate active semiconductor regions in a semiconductor wafer. In particular, FIG. 3 shows the N type region 40 that encompasses FET's Q1, Q2, Q3, Q5, Q7, and Q8 and lies along the top of the wafer below overlying insulating material and electrical connections. The overlying insulation material is not shown at all except for the areas in slanted lines running from the lower left to the upper right that represent the extensions of the dielectric material located between the channels of the various FET's and their gate electrodes which are shown as unshaded areas. The area shaded in slanting lines running from the upper left to the lower right represents the recessed insulating material 42 laterally separating the various active regions such as region 40 from one another. The overlying electrical connections are indicated as thick lines extending between the insulated-gate electrodes and the contact windows which are depicted as small rectangles or squares. Each buried contact window is further indicated with an "X". In addition to the reference symbols previously defined, "S", "D", and "G" followed by a number which is the numerical part of the symbol for an FET indicate its source, drain, and insulated-gate electrode, respectively. An item that serves as a common element for two or more FET's is indicated by the appropriate reference symbol separated by a slash.

Figure 4:
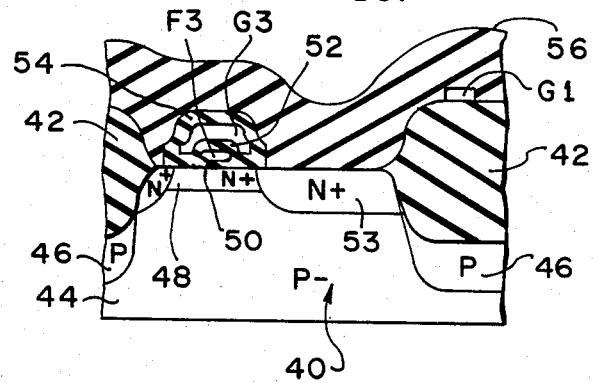
FIG. 4 is a cross-sectional side view of the memory cell of FIG. 3.

To further illustrate the construction of the memory circuit of the invention, FIG. 4 shows a cross-sectional side view of a portion of the embodiment of FIG. 3 taken through the plane 4—4 therein. All of the elements circuit of FIG. 1 not shown in FIG. 4 as well as all of the other transistors, resistors, and other elements of the present memory circuit including the external read/write circuit are preferably fabricated in the manner described below. Furthermore, memory cell 30 and its read/write circuit are fabricated in this manner.

Conventional masking, etching, and cleaning techniques are employed in creating the various doped regions shown in FIG. 4. To simplify the discussion, references to the masking, etching, cleaning, and other such well known steps in the semiconductor art are omitted from the following fabrication discussion.

Boron is utilized as the P-type impurity for creating the regions of P-type conductivity on the wafer. Phosphorus and arsenic are used selectively as the complementary N-type dopants. Other appropriate impurities may be used in place of these dopants. In many of the ion implantation steps, an impurity may alternatively be introduced into the wafer by diffusion or vice versa.

The starting material is a $<100>$ P-type monocrystalline silicon substrate 44 having a resistivity of about 25 ohm-cm. Boron (B+) is selectively ion implanted at a dosage of $6 \times 10^{13}$ ions/cm² and at an energy of 60 kiloelectron volts (KEV) into the field areas—i.e., the areas outside of the intended active areas such as region 40. Oxide-isolation region 42 having a depth of about 1.0 micron is then formed according to conventional techniques to define active region 40 and laterally electrically isolate it from other such active regions. During the formation of oxide region 42, the boron implanted in the field areas diffuses further downward to form P anti-inversion region 46 that lies below region 42 and extends partly up its sidewalls.

Arsenic (As+) is then selectively implanted at a dosage of $3 \times 10^{13}$ ions/cm² and at an energy of 100 KEV into region 40 to create N+ region 48 generally below the intended location for the tunneling insulating layer. A 1,000-angstrom layer of silicon dioxide is grown along the upper surface of region 40. The portion of this oxide layer above the intended site for gate F3 is etched away down to the underlying silicon. At the exposed silicon, a thin layer of silicon dioxide having a thickness of about 80 angstroms is grown. A first layer of intrinsic polycrystalline silicon (polysilicon) having a thickness of about 2,500 angstroms is deposited on the top of the wafer. Arsenic (As+) is implanted at a dosage of $5 \times 10^{13}$ ions/cm² and at an energy of 100 KEV into the first polysilicon layer to make it conductive. Resistors R1 and R2 and gate F3 are now defined in the first polysilicon layer by appropriately patterning it. The exposed silicon dioxide on the top of the wafer is etched away down to the underlying silicon. Below gate F3, this leaves tunneling oxide layer 50 as the remaining portion of the 80-angstrom oxide layer. The top of the wafer is oxidized to grow a 700-angstrom layer of silicon dioxide from the monocrystalline silicon and a 900-angstrom oxide region 52 from the polysilicon above and along side gate F3.

The FET threshold voltages are now established by implanting arsenic (As+) at a dosage of $1.0 \times 10^{12}$ ions/cm$^2$ and at an energy of 100 KEV into the channel area for FET Q5 and then implanting boron (B+) at a dosage of $4 \times 10^{11}$ ions/cm$^2$ and at an energy of 45 KEV into the channel areas for FET's Q1, Q2, Q5, Q7, and Q8. After selectively etching the intended areas for the buried contacts down to the monocrystalline silicon, a second layer of polysilicon is deposited on the top of the wafer. Phosphorus is then diffused into the second polysilicon layer to achieve a sheet resistance of 30 ohms/square. The second polysilicon layer is patterned by selective etching so as to define electrodes G1, G2, G3, G5, G7, and G8, the intermediate electrical connections extending from these electrodes, and the electrical connections connecting the ends of resistors R1 and R2 to their buried contact areas. The exposed silicon dioxide at the top of the wafer is etched down to the underlying silicon, after which a 300-angstrom barrier oxide layer is grown. Arsenic (As+) is selectively implanted at a dosage of $1 \times 10^{16}$ ions/cm$^2$ and at an energy of 120 KEV through the barrier oxide layer to form the N+ source/drain regions such as N+ source S3. The wafer is subjected to an oxidizing environment to increase the thickness of the barrier oxide layer to 600 angstroms at the source/drain areas. The polysilicon also oxidizes during this step so as to leave a 1,000-angstrom oxide layer 54 on top of electrode G3.

The wafer is now finished according to conventional techniques. A layer 56 of Vapox (silicon dioxide with about 8% $P_2O_5$) is deposited on the top of the wafer. Holes are etched through the Vapox layer down to the underlying silicon at locations intended for the contacts for supplies $V_{DD}$ and $V_{SS}$ and lines 25 and 26. Phosphorus is then diffused through these holes into the underlying silicon to attain a sheet resistance of about 6 ohms/square. Aluminum with 1% silicon is deposited on top of the wafer and patterned to create lines 25 and 26 and the electrical conductors leading to the $V_{DD}$ and $V_{SS}$ supplies. After annealing the wafer to alloy the aluminum to the silicon and repair lattice damage, a passivation layer is deposited on the top of the wafer to provide scratch protection, and openings are formed through the passivation layer to expose the external contacts.

While the invention has been described with reference to particular embodiments, this description is solely for the purpose of illustration and is not to be construed as limiting the scope of the invention claimed below. For example, semiconductor materials of opposite conductivity type to those described above may be employed to accomplish the same results. The variable-threshold FET(s) could be MNOS devices. Thus, various modifications, changes, and applications may be made by those skilled in the art without departing from the true scope and spirit of the invention as defined by the appended claims.

What is claimed is:

1. A memory cell wherein: a volatile storage location has first and second cross-coupled like-polarity field-effect transistors (FET's) whose sources are coupled to a reference voltage supply that provides a reference voltage and whose drains are coupled through a load circuit to a power supply that provides a supply voltage at a first level for normal storage of a given data bit in the cross-coupled FET's; a non-volatile storage location has a like-polarity variable-threshold insulated-gate FET whose insulated-gate electrode is coupled to the drain of the second FET, whose drain is coupled to the power supply, and whose source is coupled to the drain of the first FET; the non-volatile storage location assumes a logic state corresponding to the given data bit when the supply voltage is moved to a second level where the absolute value of the difference between the second level and the reference voltage exceeds the absolute value of the difference between the first level and the reference voltage; and the given data bit is automatically restored to the cross-coupled FET's when the supply voltage is returned to the first level; characterized in that the load circuit comprises: a first impedance element coupled between the power supply and the drain of the first FET along a path electrically in parallel with the path coupling the variable-threshold FET between the power supply and the drain of the first FET; and a second impedance element coupled between the power supply and the drain of the second FET.

2. A memory cell as in claim 1 wherein the threshold voltage of the variable-threshold FET (1) increases as a control voltage applied from its insulated-gate electrode to its source is increased within at least a first voltage range and (2) decreases as a control voltage applied from its source to its insulated-gate electrode is increased within at least a second voltage range, characterized in that the total current through the first impedance element and the variable-threshold FET between its source and its drain when it is substantially fully conductive significantly exceeds the current through the second impedance element and that the current through the second impedance element significantly exceeds the current through the first impedance element.

3. A memory cell as in claim 2 characterized in that each impedance element is a resistor consisting substantially of doped semiconductor material of a single conductivity type.

4. A memory cell as in claim 3 characterized in that the doped semiconductor material of each resistor is doped polycrystalline silicon.

5. A memory cell as in claim 2 characterized in that each impedance element is substantially resistive.

6. A memory cell as in claim 5 characterized by means for limiting current through the variable-threshold FET to a specified current.

7. A memory cell as in claim 6 characterized in that the means comprises a depletion-mode FET having its drain coupled to the power supply and its gate electrode and variable-threshold FET.

8. A memory cell as in claim 2, 3, 5, or 6 characterized in that the variable-threshold FET is a floating-gate FET in which its source is separated from a floating-gate electrode by a layer of electrically insulating material having a minimum thickness no greater than 200 angstroms so as to permit tunneling of charge carriers between its source and the floating-gate electrode as either control voltage is increased within its voltage range.

9. A memory cell as in claim 1 characterized by another like-polarity variable-threshold insulated-gate FET whose insulated-gate electrode is coupled to the drain of the first FET and whose drain and source are coupled respectively to the power supply and to the drain of the second FET along a path electrically in parallel with the path coupling the second impedance element between the power supply and the drain of the second FET.

10. A memory cell as in claim 9 characterized in that each impedance element is a resistor consisting substantially of doped semiconductor material of a single conductivity type.

11. A memory cell as in claim 10 characterized in that the doped semiconductor material of each resistor is doped polycrystalline silicon.

12. A memory cell as in claim 10 characterized in that the resistors have substantially equal resistances.

13. A memory cell as in claim 9 characterized in that: the threshold voltage of each variable-threshold FET (1) increases as a control voltage applied from its insulated-gate electrode to its source increases within at least a first voltage range and (2) decreases as a control voltage applied from its source to its insulated-gate electrode increases within at least a second voltage range; the variable-threshold FET's are not simultaneously fully conductive; and the current through either variable-threshold FET between its source and its drain when it is substantially fully conductive significantly exceeds the current through either impedance element.

14. A memory cell as in claim 13 characterized in that each impedance element is substantially resistive.

15. A memory cell as in claim 14 characterized by means for limiting current through each variable-threshold FET to a specified current.

16. A memory cell as in claim 15 characterized in that the means comprises a pair of substantially identical depletion-mode FET's of which each has its drain coupled to the power supply, one has its gate electrode and its source coupled together to the drain of one of the variable-threshold FET's, and the other has its gate electrode and its source coupled together to the drain of the other of the variable-threshold FET's.

17. A memory cell as in claim 13, 10, 14 or 15 characterized in that each variable-threshold FET is a floating-gate FET in which its source is separated from a floating-gate electrode by a layer of electrically insulating material having a minimum thickness no greater than 200 angstroms so as to permit tunneling of charge carriers between its source and the floating-gate electrode as either control voltage is increased within its voltage range.

* * * * *

UNITED STATES PATENT AND TRADEMARK OFFICE
CERTIFICATE OF CORRECTION

PATENT NO. : 4,527,255
DATED      : July 2, 1985
INVENTOR(S) : PARVIS KESHTBOD

It is certified that error appears in the above-identified patent and that said Letters Patent is hereby corrected as shown below:

```
Claim 7, fourth line, after "and" insert
        -- its source coupled together to the drain of the --.
```

Signed and Sealed this

Seventeenth Day of December 1985

[SEAL]

Attest:

DONALD J. QUIGG

Attesting Officer

Commissioner of Patents and Trademarks